US010175893B2

(12) United States Patent
Bonanno et al.

(10) Patent No.: US 10,175,893 B2
(45) Date of Patent: Jan. 8, 2019

(54) PREDICTIVE SCHEDULER FOR MEMORY RANK SWITCHING

(71) Applicant: INTERNATIONAL BUSINESS MACHINES CORPORATION, Armonk, NY (US)

(72) Inventors: James J. Bonanno, Wappingers Falls, NY (US); Michael J. Cadigan, Jr., Poughkeepsie, NY (US); Adam B. Collura, Hopewell Junction, NY (US); Daniel Lipetz, Linden, NJ (US); Patrick J. Meaney, Poughkeepsie, NY (US); Craig R. Walters, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/659,863

(22) Filed: Jul. 26, 2017

(65) Prior Publication Data

US 2018/0173429 A1    Jun. 21, 2018

Related U.S. Application Data

(63) Continuation of application No. 15/382,844, filed on Dec. 19, 2016.

(51) Int. Cl.
*G06F 3/06* (2006.01)
*G11C 11/4091* (2006.01)
*G11C 11/406* (2006.01)

(52) U.S. Cl.
CPC .......... *G06F 3/0611* (2013.01); *G06F 3/0632* (2013.01); *G06F 3/0659* (2013.01);
(Continued)

(58) Field of Classification Search
None
See application file for complete search history.

(56) References Cited

U.S. PATENT DOCUMENTS 6,112,265 A     8/2000  Harriman et al.
6,141,283 A  *  10/2000  Bogin ................... G06F 1/3225
                                                    365/226
(Continued)

FOREIGN PATENT DOCUMENTS

CN         1375831 A      10/2002

OTHER PUBLICATIONS

Krishnapillai et al., "ROC: A Rank-switching, Open-row DRAM Controller for Time-predictable Systems", Published in 2014 26th Euromicro Conference on Real-Time Systems (ECRTS), Jul. 8-11, 2014, Madrid, Spain, pp. 27-38.
(Continued)

*Primary Examiner* — Jaweed A Abbaszadeh
*Assistant Examiner* — Cheri Harrington
(74) *Attorney, Agent, or Firm* — Dmitry Paskalov

(57) ABSTRACT

Scheduling memory accesses in a memory system having a multiple ranks of memory, at most r ranks of which may be powered up concurrently, in which r is less than the number of ranks. If fewer than r ranks are powered up, a subset of requested powered down ranks is powered up, such that at r ranks are powered up, the subset of requested powered down ranks to be powered up including the most frequently accessed requested powered down ranks. Then, if fewer than r ranks are powered up, a subset of unrequested powered down ranks is powered up, such that a total of at most r ranks is powered up concurrently, the subset of unrequested powered down ranks to be powered up including the most frequently accessed unrequested powered down ranks.

1 Claim, 9 Drawing Sheets

(52) U.S. Cl.
CPC ........ *G06F 3/0673* (2013.01); *G11C 11/4091* (2013.01); *G11C 11/40618* (2013.01)

(56) References Cited

U.S. PATENT DOCUMENTS

| | | | |
|---|---|---|---|
| 6,442,698 B2* | 8/2002 | Nizar | G06F 1/3225 713/320 |
| 6,470,433 B1 | 10/2002 | Prouty et al. | |
| 6,526,484 B1 | 2/2003 | Stacovsky et al. | |
| 6,574,676 B1 | 6/2003 | Megiddo | |
| 6,738,865 B1 | 5/2004 | Burton et al. | |
| 7,028,200 B2 | 4/2006 | Ma | |
| 7,573,715 B2* | 8/2009 | Mojaver | G06F 1/181 361/716 |
| 7,580,309 B2* | 8/2009 | Yang | G06F 13/1636 365/222 |
| 7,721,011 B1 | 5/2010 | Sutera | |
| 7,721,052 B2* | 5/2010 | Ogasawara | G06F 1/3203 711/152 |
| 7,761,656 B2 | 7/2010 | Madrid et al. | |
| 7,793,129 B2* | 9/2010 | Ogasawara | G06F 1/3225 713/320 |
| 8,190,804 B1 | 5/2012 | Srinivasan et al. | |
| 8,484,397 B1 | 7/2013 | Srinivasan et al. | |
| 9,367,248 B2 | 6/2016 | Hampel et al. | |
| 9,477,586 B1 | 10/2016 | Hedinger et al. | |
| 9,703,500 B2* | 7/2017 | Fiske | G06F 3/0625 |
| 2003/0225969 A1 | 12/2003 | Uchida et al. | |
| 2004/0068672 A1* | 4/2004 | Fisk | G06F 1/3221 713/323 |
| 2007/0011421 A1* | 1/2007 | Keller, Jr. | G06F 1/3225 711/165 |
| 2007/0143542 A1* | 6/2007 | Watanabe | G06F 3/0634 711/114 |
| 2008/0034234 A1* | 2/2008 | Shimizu | G06F 1/3225 713/320 |
| 2008/0104431 A1* | 5/2008 | Shimada | G06F 1/3221 713/300 |
| 2009/0055570 A1* | 2/2009 | Madrid | G06F 12/0215 711/5 |
| 2009/0300397 A1 | 12/2009 | Nguyen et al. | |
| 2010/0169700 A1* | 7/2010 | Abraham | G06F 1/3225 713/600 |
| 2012/0023292 A1* | 1/2012 | Saito | G06F 1/3203 711/114 |
| 2012/0144144 A1* | 6/2012 | Worthington | G06F 12/0223 711/165 |
| 2013/0073886 A1* | 3/2013 | Zaarur | G06F 12/023 713/320 |
| 2014/0101381 A1* | 4/2014 | Svendsen | G06F 13/1642 711/105 |
| 2014/0372711 A1 | 12/2014 | O'Connor et al. | |
| 2015/0089164 A1 | 3/2015 | Ware et al. | |
| 2017/0053691 A1 | 2/2017 | Ware et al. | |
| 2017/0092379 A1 | 3/2017 | Kim et al. | |
| 2017/0132150 A1 | 5/2017 | Hampel et al. | |
| 2018/0067539 A1 | 3/2018 | Samson et al. | |

OTHER PUBLICATIONS

Krishnapillai, Y. et al.; "ROC: A Rank-switching, Open-row DRAM Controller for Time-predictable Systems"; 2014 26th Euromicro Conference on Real-Time Systems, pp. 27-38.

Anonymously; "Memory Controller Mode for Optimally Scheduling Reads/Writes Around zq Calibration Commands in a Multi Rank Memory Subsystem"; http://ip.com/IPCOM/000194664D; Apr. 6, 2010, pp. 1-2.

Anonymously; "Memory Testing Methodology (or) Memory Rank Level Stress Aware Testing Methodology"; http://ip.com/IPCOM/000213616D; Dec. 22, 2011, pp. 1-6.

Yu et al., "DRAM-Page Based Prediction and Prefetching", Computer Science Department, Duke University, 2000 IEEE, pp. 267-275.

Wu et al., "RAMZzz: Rank-Aware DRAM Power Management with Dynamic Migrations and Demotions", 2012 IEEE pp. 1-11.

Volos et al., "BuMP: Bulk Memory Access Prediction and Streaming", 2014 47th Annual IEEE/ACM International Symposium on Microarchitecture, pp. 545-557.

IBM: List of IBM Patents or Patent Applications Treated as Related (Appendix P), Aug. 18, 2017, pp. 1-2.

Bonanno et al., U.S. Appl. No. 15/382,844, filed Dec. 19, 2016, titled: "Predictive Scheduler for Memory Rank Switching", pp. 1-40.

* cited by examiner

PREDICTIVE SCHEDULER FOR MEMORY RANK SWITCHING

BACKGROUND

The present invention relates generally to accessing and controlling memory, and more particularly to memory controllers for multi-rank dynamic random access memory (DRAM) systems.

Memory modules are often designed with two or more independent sets of DRAM chips connected to the same command/address and data buses. Each such set is called a rank. Multiple ranks can coexist on a single dual in-line memory module (DIMM), and modern DIMMs consist of from one to eight ranks per module. Ranks offer a form of memory access parallelism; however, since the ranks on a single DIMM typically share the same command/address and data buses, a DRAM controller can generally access only one rank at a time. In this case, the rank to be accessed is powered up and all other ranks are powered down for the duration of the memory operation. Because such rank switching incurs a delay, DRAM controllers may employ a procedure for rank switching that is designed to increase DRAM bandwidth and improve performance.

SUMMARY

Embodiments of the present invention disclose a computer-implemented method and a system for scheduling memory accesses in a memory system having a multiple ranks of memory, at most r ranks of which may be powered up concurrently, in which r is less than the plurality of ranks. In response to determining that fewer than r ranks are powered up, a subset of requested powered down ranks is powered up, such that at most a total of r ranks is powered up, in which the subset of requested powered down ranks to be powered up includes the most frequently accessed requested powered down ranks, based on a number of memory requests received by the requested powered down ranks within a defined time window. Then, in response to determining that fewer than r ranks are powered up, a subset of unrequested powered down ranks is powered up, such that a total of at most r ranks is powered up concurrently, in which the subset of unrequested powered down ranks to be powered up includes the most frequently accessed unrequested powered down ranks, based on a number of memory requests received by the unrequested powered down ranks within a defined time window.

DETAILED DESCRIPTION

Dynamic random access memory (DRAM) is a type of volatile memory that offers a good balance between storage capacity and price, but comes with significant performance and latency drawbacks as well. In multi-rank memory systems, the number of ranks which can be powered up concurrently may be limited by power or heat constraints, or by certain physical constraints, for example, by a limited number of memory buses. Therefore, DRAM controllers may need to switch between ranks. Switching between ranks incurs a particularly high penalty in wasted clock cycles, not only due to time lost during power up, but also in opportunity cost, where something else productive could have been happening during that time. Each switch incurs a penalty and thrashing may multiply the penalty many times over. Because memory accesses tend to be concentrated in bursts involving different ranks at different times, significant performance gains could be made through intelligent usage of the DRAM to reduce switching penalties by identifying and exploiting these patterns of rank activity within the constraints of the DRAM controller.

Figure 1:
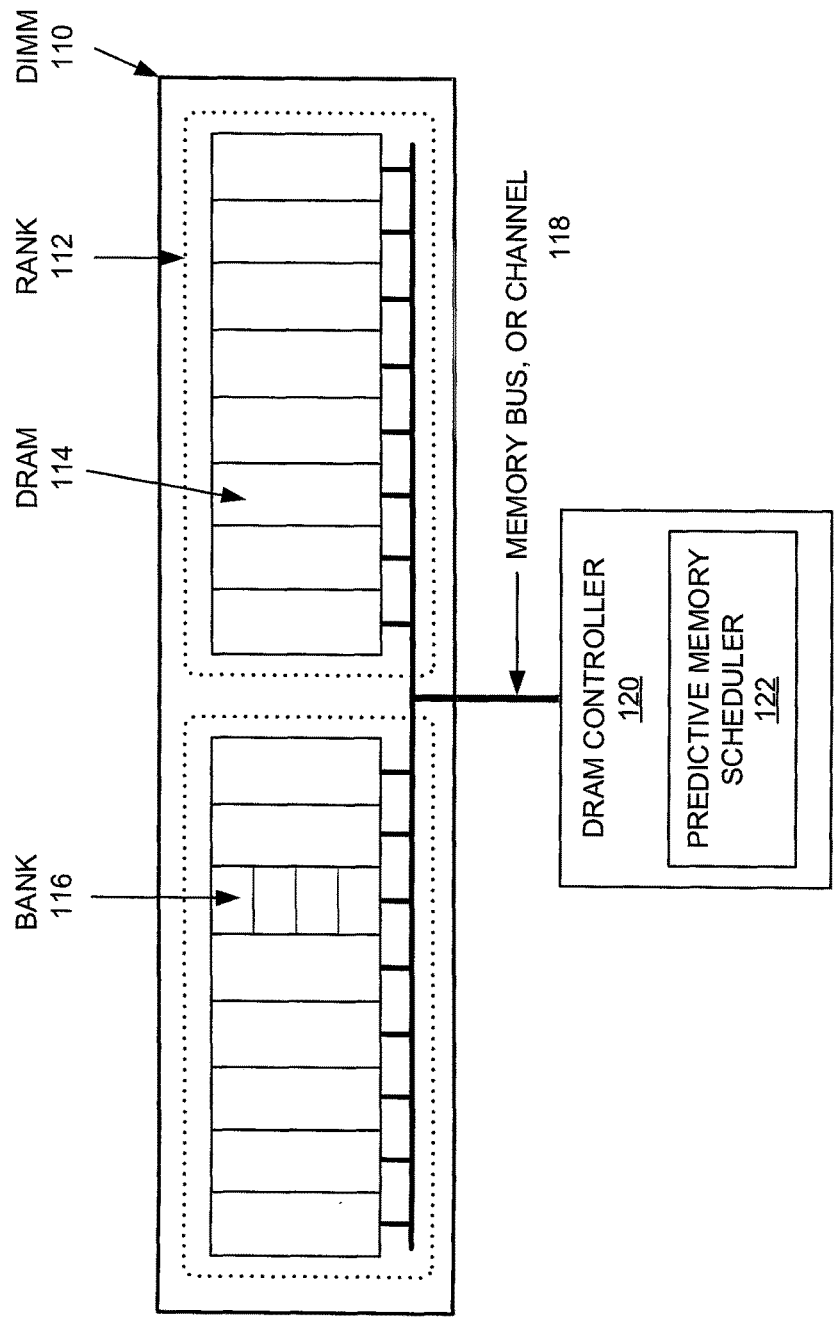
FIG. 1 is a schematic diagram of a dynamic random access memory (DRAM) system, in accordance with an embodiment of the present invention.

FIG. 1 is a schematic diagram illustrating DRAM organization, in accordance with an embodiment of the present invention. The components depicted, channel 118, dual in-line memory module (DIMM) 110, rank 112, DRAM 114, bank 116, and array (not shown), form a hierarchy in the data storage organization. DIMMs 110 may contain multiple ranks 112, which contain multiple DRAMs 114, which are subdivided into banks 116. Ranks and banks provide a form of memory access parallelism. DIMM 110 is connected to DRAM controller 120 via a memory bus, which is also called a channel 118.

DIMM 110 is a memory module that contains multiple memory chips such as DRAMs 114 on a printed circuit board (PCB) with pins that connect it to a computer motherboard. Current DIMMs have between 72 and 288 pins and support 64-bit data transfer. DIMMs may differ in module density, voltage requirements, and data transfer speeds, among other features. The DRAMs on DIMM 110 are grouped into ranks 112, which are independent sets of DRAM chips. DIMM 110 is shown with two ranks 112; however, current DIMMs may have up to eight ranks.

A rank 112 contains two or more independent sets of DRAM chips connected to the same command/address and data buses A rank generally corresponds to a data block that is 64 bits wide. On systems that support error correction code (ECC), an additional 8 bits are added, which makes the data block 72 bits wide. The number of physical DRAMs 114 in a rank depends on their individual data widths. For example, a rank of x8 (8 bit wide) DRAMs consist of eight physical chips, or nine if ECC is supported, but a rank of x4 (4 bit wide) DRAMs consists of 16 physical chips (18 if ECC is supported). Multiple ranks 112 can coexist on a single DIMM 110, and modern DIMMs may consist of from one to eight ranks, according to current standards. Ranks on a memory module share the same command/address and data buses. During memory access scheduling, ranks may be selected for powering up or powering down. A rank that is powered up may be referred to as 'open' and a rank that is powered down may be referred to as 'closed.' Each rank 112 in FIG. 1 is shown with eight DRAMs, each corresponding to a data block of eight bits (i.e., x8), so a rank corresponds to a data block of 64 bits. Other numbers of DRAMS are possible.

DRAM 114 is a memory chip that stores each bit of data in a separate capacitor within an integrated circuit. The capacitor can be either charged or discharged; these two states are taken to represent the two values of a bit, conventionally called 0 and 1. As the capacitors slowly discharge, the information eventually fades, unless the capacitor charge is periodically refreshed. The term "dynamic" refers to this refresh requirement. DRAM 114 contains multiple banks 116, which share command/address and data buses. With DRAM 114, after a word is fetched from memory, the memory is typically inaccessible for an extended period of time while its sense amplifiers are charged to access the next cell. By interleaving the memory (e.g., cells 0, 4, 8, etc. may be stored together in one rank), sequential memory accesses can be performed more rapidly, because sense amplifiers have several cycles of idle time for recharging between accesses. In various embodiments of the invention, the term clock cycle may refer to a system clock cycle or a memory controller clock cycle.

Banks 116, while similar from a logical perspective to ranks 112, are implemented differently in physical hardware. Banks are sub-units inside a DRAM 114. Similar to the CS signal, banks are selected via bank select bits that are part of the memory interface. Thus, a bank 116 corresponds to a block of memory in a DRAM chip, while a rank corresponds to a block of memory on a DIMM 110. Current standards allow for up to 16 banks 116 per chip.

A memory bus, or channel 118, includes command/address and data buses. Channels are the highest-level structure at the local DRAM controller level. Modern computers may have multiple channels, either one per DRAM controller, or with several channels operated by a single DRAM controller. A single channel 118 may be associated with one or more DIMMs 110 or one or more ranks 112 on a DIMM. Multiple channels can increase the effective data transfer rate between DIMMs 110 and a DRAM controller 120. With multiple channels 118, memory access latency may be reduced by interleaving memory requests to different DIMMs. For example, data may be written to different DIMMs in an alternating pattern, effectively increasing available memory bandwidth for the same amount of data, as opposed to storing it all on one DIMM. In an exemplary embodiment of the present invention, the number of channels 118 is less than the number of ranks.

DRAM controller 120 is a digital circuit that manages the flow of data, primarily between a computer's CPU and main memory, for example DIMM 110. DRAM controller 120 may be a separate chip, or it may be integrated in the CPU. DRAM controllers contain the logic necessary to read and write to DRAM 114, and to "refresh" the DRAM. As mentioned, without constant refreshes DRAM will lose the data written to it within a fraction of a second. DRAM controller 120 communicates with DIMMs 110 via one or more channels 118, which transmit addresses and commands to the DIMMs, and data to and from the DIMMs. Modern DRAM controllers not only handle CPU memory requests efficiently, but can also reorder requests to exploit the memory parallelism available with DRAMs that have multiple ranks 112 and banks 116. This may lead to a reduction in request latency and to faster CPU performance. Moreover, by reordering memory accesses, DRAM controller 120 may reduce energy used by the DRAMs, which may be a significant fraction of overall system power usage.

DRAM controller 120 is responsible for scheduling memory requests directed to specific ranks. It is also responsible for ensuring that overall rank usage does not violate certain constraints. For example, in an embodiment of the invention, DRAM controller 120 may ensure that the number of ranks that are powered up does not exceed a specified number, in order to limit the overall power consumed by those ranks. In an embodiment of the invention, DRAM controller 120 hosts predictive memory scheduler 122.

In accordance with embodiments of the invention, predictive memory scheduler 122 operates generally to power down ranks whose operations have completed, power up ranks to process new memory requests, and predictively, i.e., speculatively, power up ranks in anticipation of future memory requests to the ranks. Predictively powering up ranks may reduce latency in more frequently used ranks.

In various embodiments of the invention, predictive memory scheduler 122 operates generally to identify more frequently used and less frequently used ranks 112 by tracking memory access patterns over an interval of time and using this knowledge to predict whether switching ranks would be advantageous. In an embodiment of the invention, predictive memory scheduler 122 maintains two counts for each rank i to assist in predictively powering up ranks, an 'inactive count' ICi and an 'active count' ACi, which keep track of memory accesses to the rank and are incremented or decremented, respectively. In various embodiments, ACi and ICi may be maintained in hardware counters or may be implemented in software. Predictive memory scheduler 122 also associates with each rank i an 'active window' of size Xi. Xi is a defined time window corresponding to an expected length of a sequence of memory operations for rank i. Xi may be a positive integer that represents the number of clock cycles during which a rank may be preferred to remain open in anticipation of future memory accesses to the rank. This may allow more frequently used ranks to be accessed more efficiently with minimal delay penalties. In an embodiment, for a rank i, active count ACi, may be initialized to Xi and may represent the number of cycles likely remaining in the current sequence of memory operations that use that rank. The value of ACi may depend on Xi, its loaded value, and on how recently the current sequence of rank operations was started, i.e., how often ACi was subsequently decremented.

In embodiments of the invention, Xi may be adjusted dynamically based on feedback from ACi and ICi, and these values may be used to identify more frequently accessed and less frequently accessed ranks. In deciding whether to power up a currently powered down rank, predictive memory scheduler 122 may give priority in scheduling memory accesses to more frequently accessed ranks over less frequently accessed ranks. For example, an application program accessing a rank may experience an interrupt involving a small number of accesses to a different rank. It may be desirable to keep the focus on the current program's memory locations rather than on the interrupt requirements. In some cases, performance may be improved by allowing less frequently accessed ranks to compete with each other for limited memory cycles or a limited number of available channels 118; predictive memory scheduler 122 may be able to identify such cases.

Dynamically adjusting the size of the active window provides feedback to predictive memory scheduler 122 about how long the active count ACi should be maintained. A reduction of active window size Xi may indicate that rank i might have been powered down sooner without negatively impacting performance. In this way, predictive memory scheduler 122 may "learn" to power down a rank sooner. An increase in active window size Xi may indicate that rank i might have been kept powered on longer, which might have allowed for more efficient utilization of DRAM resources.

Figure 2:
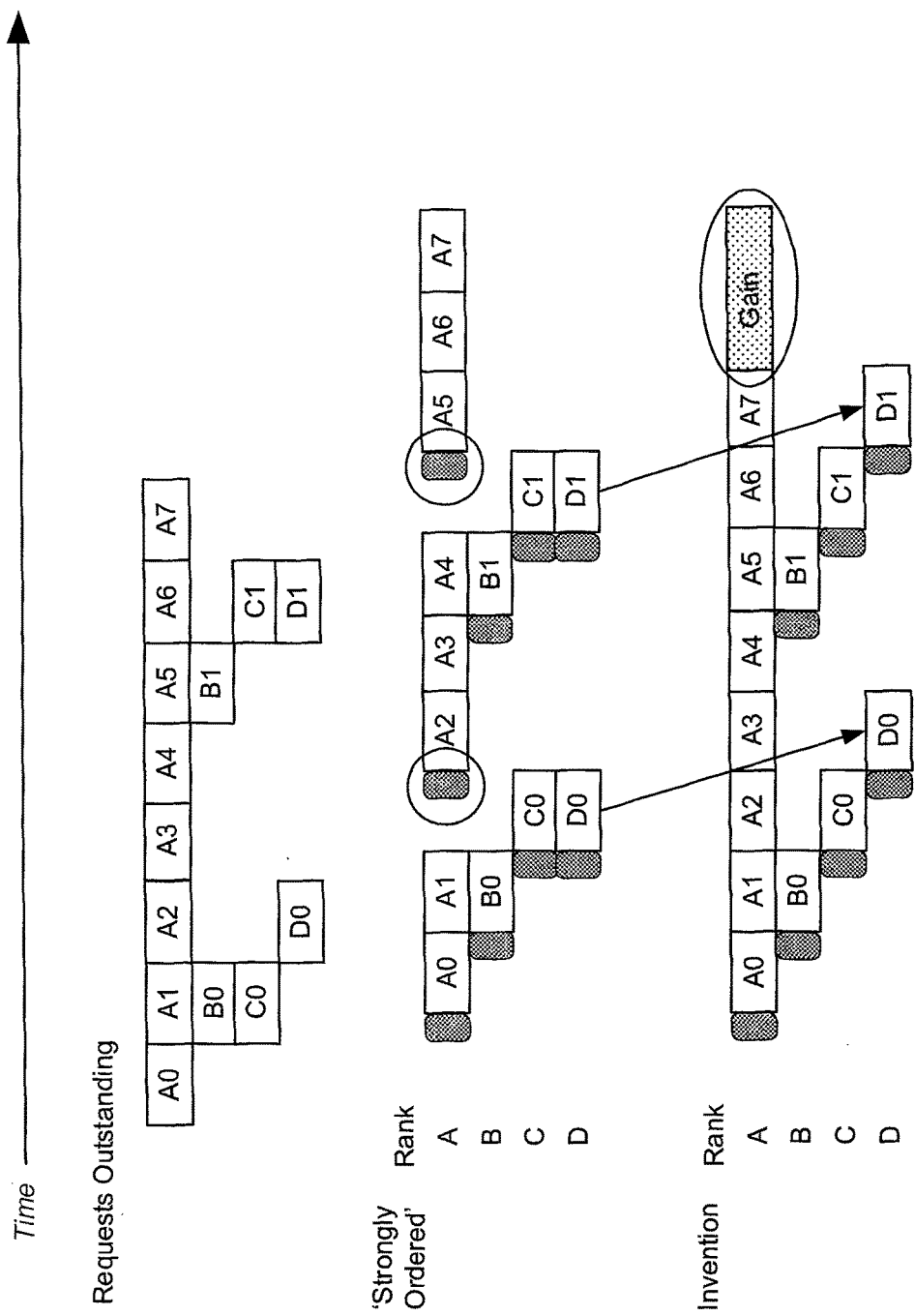
FIG. 2 is an example timing diagram comparing memory access scheduling with a current memory access scheduling algorithm to memory access scheduling in accordance with an embodiment of the present invention.
Figure 3:
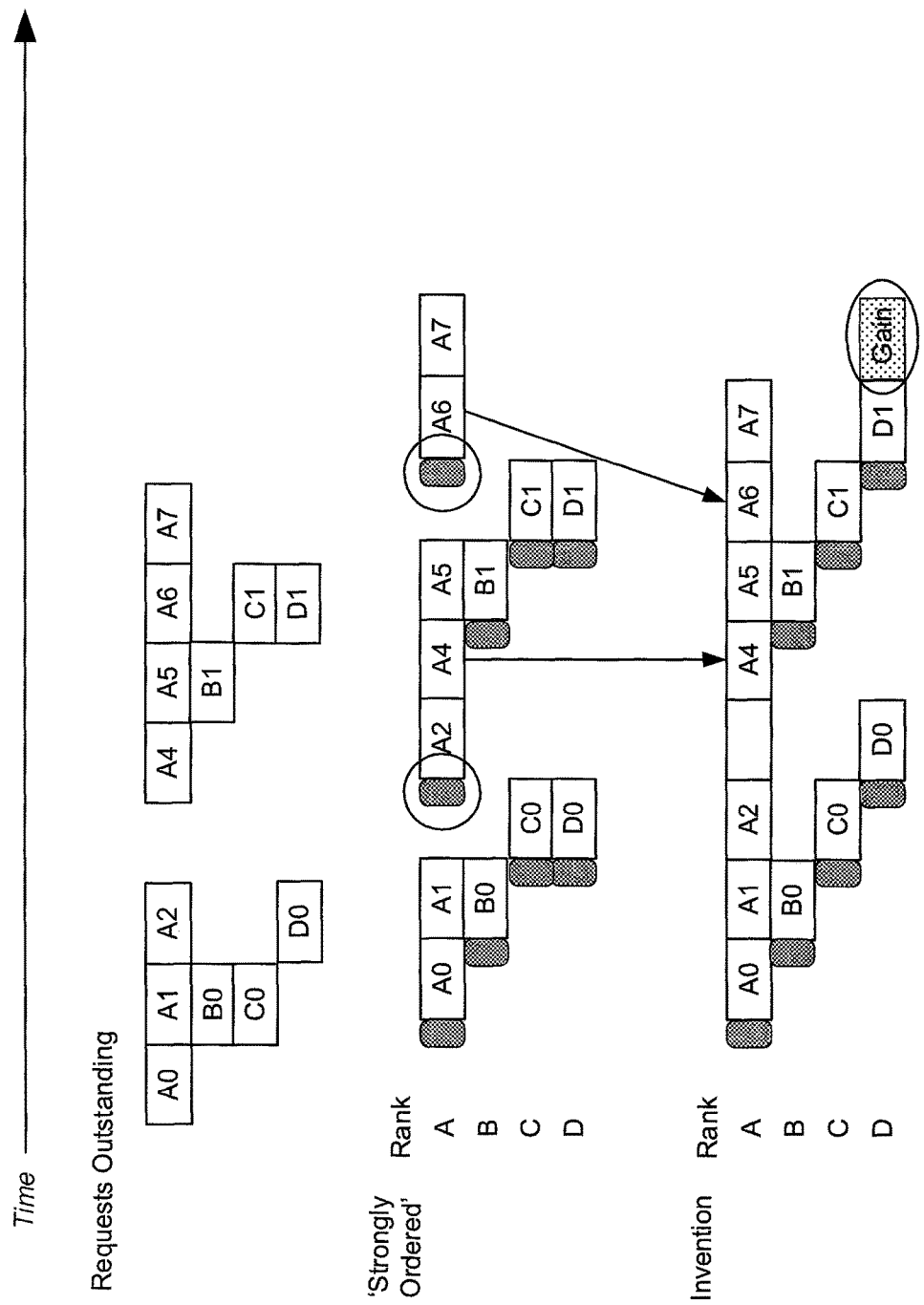
FIG. 3 is another example timing diagram comparing memory access scheduling with a current memory access scheduling algorithm to memory access scheduling in accordance with an embodiment of the present invention.
Figure 4:
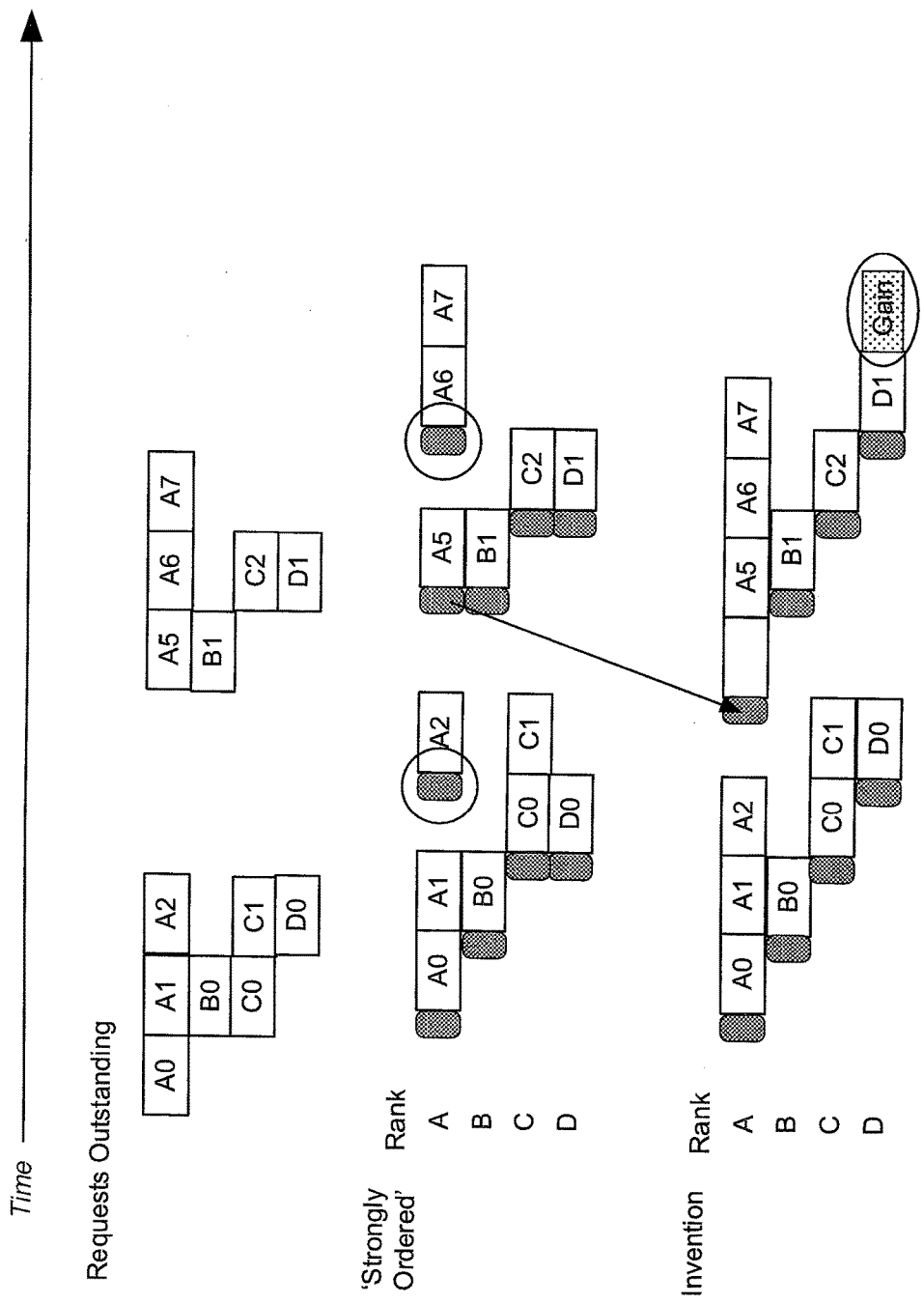
FIG. 4 is another example timing diagram comparing memory access scheduling with a current memory access scheduling algorithm to memory access scheduling in accordance with an embodiment of the present invention.

FIGS. 2-4 present timing diagrams for which processing of a sequence of memory requests according to an embodiment of the present invention may be accomplished in less time than may be required using a standard approach to processing memory requests.

FIG. 2 is an example timing diagram in which memory request scheduling using a standard approach to scheduling memory requests, labeled "strongly ordered," is compared to memory request scheduling according to an embodiment of the present invention. In a strongly ordered model, the order of memory requests is maintained and a memory request is not processed until the previous memory request has completed. FIG. 2 shows four ranks 112, labeled A, B, C, and D, of which, only two may be powered up at a time, due, for example, to power constraints, physical constraints, etc. For example, the four ranks may compete for two available channels 118. Based on the number of requests outstanding, rank A is a more frequently accessed rank and ranks B, C, and D are less frequently accessed. Using the strongly ordered model, rank A would be powered up when request A0 is pending and rank B would be powered up when B0 is pending, during the processing of request A0. The power up cycles, i.e., the times required to powered up ranks A and B, which typically take several clock cycles, are indicated by shaded boxes. Rank A would remain powered up while A0 and A1 are processed, then it would be powered down as requests C0 and D0 are processed, which begins with powering up ranks C and D during the processing of requests A1 and B0. In an embodiment of the invention, predictive memory scheduler 122 predicts that A is a more frequently accessed rank and keeps it powered up while memory requests A0-A7 are processed. As indicated with arrows, memory requests D0 and D1 are serviced later than with the strongly ordered model, but overall two access times of 14 total accesses are saved, as indicated by the box labeled "Gain." Two power up cycles (circled) are also saved.

FIG. 3 is another example timing diagram in which strongly ordered memory request scheduling is compared to memory request scheduling according to an embodiment of the present invention. In FIG. 3, four ranks 112, labeled A, B, C, and D are present, but only two ranks at a time may be powered up. In this example, rank A experiences a short gap between requests A2 and A4. Based on the number of requests outstanding, rank A is a more frequently accessed rank and ranks B, C, and D are less frequently accessed. With the strongly ordered model, rank A would be powered up when request A0 is pending and rank B would be powered up when B0 is pending, during the processing of request A0. The time required to power up a rank is indicated by a shaded box. Rank A would remain powered up while A0 and A1 are processed, then it would be closed while requests C0 and D0 are processed, which begins with activation of ranks C and D during the processing of requests A1 and B0. Rank A would be powered up again while requests C0 and D0 are processed, then powered down after A5 and B1 complete, after which C1 and D1 are processed. Finally, rank A would be powered up again as C1 and D1 are completing. In an embodiment of the invention, predictive memory scheduler 122 predicts that A is a more frequently accessed rank and keeps it powered up (indicated by an empty box), despite the gap, while memory requests A0-A2 and A4-A7 are processed. As in the example of FIG. 2, memory requests D0 and D1 are serviced later than with the strongly ordered model. However, because rank A was kept powered up even though no immediate outstanding request was present, A4 and A6 are processed sooner (as indicated with arrows) and one access time is saved, as indicated by the box labeled "Gain." Two power up cycles (circled) are also saved.

FIG. 4 is a further example timing diagram in which strongly ordered memory request scheduling is compared to memory request scheduling according to an embodiment of the present invention. In FIG. 4, four ranks 112, labeled A, B, C, and D are present, but only two ranks at a time may be powered up. In this example, rank A experiences a large gap between requests A2 and A5. Predictive memory scheduler 122 (FIG. 1) determines, based on the number of requests outstanding, that rank A is a more frequently accessed rank, and that ranks B, C, and D are less frequently accessed. However, due to the large gap in A and the demands of B, C, and D, predictive memory scheduler 122, in an embodiment of the invention, powers down and switches away from rank A (in contrast to the previous examples), then predictively powers up rank A again (indicated with an arrow and an empty box) before request A5 arrives. As shown, this saves one access time, as indicated by the box labeled "Gain." Two power up cycles (circled) are also saved.

Figure 5:
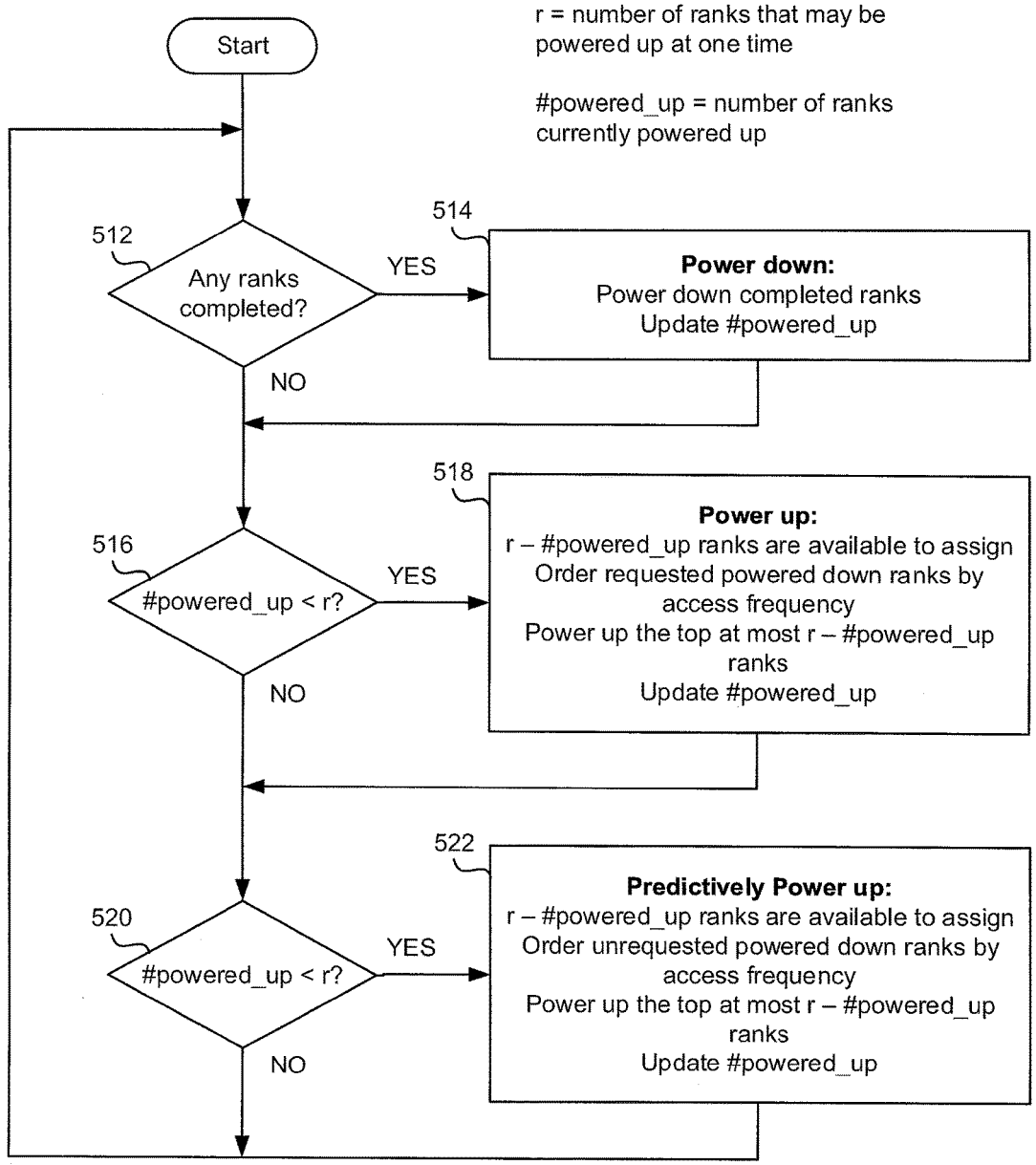
FIG. 5 is a flowchart depicting various steps of a method for scheduling memory accesses, in accordance with an embodiment of the present invention.

FIG. 5 is a flowchart depicting various operational steps that may be performed by DRAM controller 120 in executing predictive memory scheduler 122, in accordance with an exemplary embodiment of the invention. In FIG. 5, r denotes the number of ranks 112 that may be powered up concurrently, within the constraints of the system. In embodiments of the invention, r is less than the number of ranks present. In an embodiment, predictive memory scheduler 122 inspects outstanding memory requests to determine which requests to schedule for a rank and which requests to postpone. Outstanding memory requests may include 'open' memory requests (i.e., requests that are already executing in memory) and queued memory requests (i.e., those requests that have been received, but have not yet been scheduled for execution). Predictive memory scheduler 122 determines a subset of at most r ranks to power up to perform the outstanding memory requests. In an embodiment, predictive memory scheduler 122 powers up a subset of ranks in anticipation of new rank requests, such that no more than r ranks are powered up at a time, in order to reduce latency.

In embodiments of the invention, ranks that were previously powered up and are still actively performing memory operations are kept powered up as long as they are still executing in memory. For example, if a rank B is performing a store operation and a rank C is performing a fetch operation, then ranks B and C will both remain powered up. In an embodiment, the active counts AC are greater than zero while the associated ranks are actively performing memory operations. In an embodiment, during a high rate of memory request queuing, ranks are powered down as soon as they are no longer in use in order to allow other ranks to power up sooner.

In FIG. 5, the number of ranks that are powered up is denoted by #powered_up. In embodiments of the invention, ranks may be assessed to determine if they need to be powered down or kept powered up. In an embodiment, if an open rank has completed all its outstanding open memory requests (step 512), the open rank is powered down (step 514). The value of #powered_up may be updated to reflect the remaining number of active ranks. In an embodiment of the invention, when the active count ACi for rank i is equal to 0 the rank operations are deemed complete.

If the number of powered up ranks is less than r (#powered_up<r, step 516), ranks are assessed to determine if they can be powered up (step 518). For best performance, it may be advantageous to power up as many ranks as possible, subject to the restriction #powered_up≤r. At most, a total of r−#powered_up ranks can be additionally powered up in order not to exceed r. For all ranks that are powered down, the ranks are prioritized for powering up and ordered from highest to lowest priority. For example, ranks may be ordered by their corresponding AC value, highest to lowest. The top r−#powered_up powered down, requested ranks in the ordered list may be powered up. For example, if a powered down rank A has an AC of 2000 and a powered down rank D has an AC of 2200, with r=2 and #powered_up=1, then rank D may be powered up while rank A is not powered up at the current assessment time. The value of #powered_up is updated to reflect the remaining number of powered up ranks.

If fewer than r ranks are powered up (#powered_up<r, step 520), ranks may be assessed to determine if they can be predictively (i.e., speculatively) powered up (step 522). For best performance, it may be advantageous to power up as many ranks as possible, subject to the restriction #powered_up≤r. At most, a total of r−#powered_up ranks can be additionally powered up in order not to exceed r. For all ranks that are powered down, the ranks are prioritized for powering up and ordered from highest to lowest priority. For example, the ranks may be prioritized according to their active window size Xi, largest to smallest. A larger value of Xi may indicate that the rank has been accessed more frequently in the past. A larger Xi value may also mean the rank operation sequence was active for a longer period of time in the past. The top r−#powered_up powered down, unrequested ranks in the ordered list may be predictively powered up. For example, if a powered down rank B has an X value of 2300 and a powered down rank C has an X value of 2100, with r=2 and #powered_up=1, then rank B will be predictively powered up while rank C will not be predictively powered up. The value of #powered_up is updated to reflect the remaining number of powered up ranks.

In an embodiment, after each cycle, the powered up ranks and the new memory requests may be assessed according to their updated ACi, ICi, and Xi values.

In an exemplary embodiment, the calculated values ACi, ICi, and Xi are used in determining more frequently accessed and less frequently accessed ranks. In other embodiments, alternative methods of determining more or less frequently accessed ranks may be employed, as will be appreciated by those skilled in the art. Implementation details presented here are not intended to limit the scope of the invention.

FIG. 5 represents a guideline for memory access scheduling, in accordance with an embodiment of the invention, and is not intended to limit the scope of the invention. For example, in an embodiment, the step of powering down a rank i that has completed its rank operations (step 514), combined with the step of predictively powering up the same rank (step 522), can be implemented by keeping rank i powered up, thus skipping a power down and a power up step. In an embodiment, the step of predictively powering up a rank (step 522) may skip the rank activation step. In that case, rank activation can occur after a memory request is made for performing an operation to that rank. Those skilled in the art will appreciate that numerous other changes to the method may be made without deviating from the scope of the invention.

Likewise, while saving power is described as a motivation in various embodiments presented here, embodiments for other purposes may be implemented without deviating from the intent of the invention. For instance, other embodiments may limit rank usage to reduce thermal constraints, to comply with lower noise emissions, to save on cost, to improve reliability, etc. Also, the use of rank, bank, channel, DRAM, DIMM, and other terms refer to various embodiments presented herein. Other embodiments, including different memory devices and architectures, both volatile and non-volatile, are contemplated.

Figure 6:
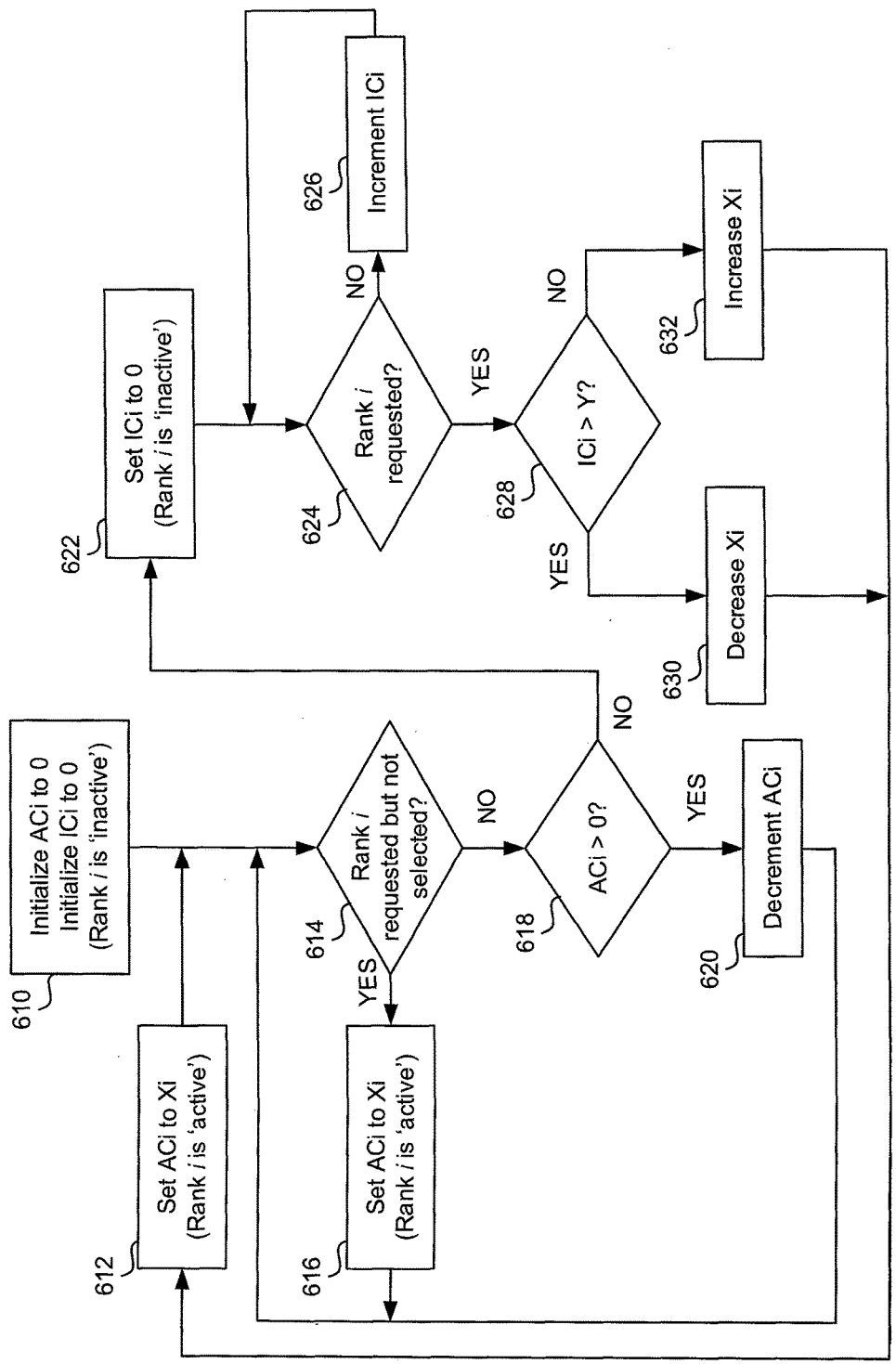
FIG. 6 is another flowchart depicting various steps of a method for scheduling memory accesses, in accordance with an embodiment of the present invention.

FIG. 6 is another flowchart depicting various operational steps that may be performed by DRAM controller 120 in executing predictive memory scheduler 122, in accordance with an exemplary embodiment of the invention. The flowchart depicts dynamically adjusting the active window size X for a rank, based on feedback from the two count values AC and IC associated with the rank.

For each rank i of two or more ranks 112, the following steps are performed. Active count ACi and inactive count ICi are initially set to 0 (step 610). Thus, rank i is initially 'inactive.' After each clock period, which may be, for example, a clock cycle or a memory cycle, predictive memory scheduler 122 checks if rank i has been requested but not selected during that cycle (decision step 614). A rank is requested when a fetch or store operation to DRAM controller 120 has an address that targets that rank. A rank is requested, whether the rank is queued up waiting for priority for the fetch or store operation or it is in the process of fetching or storing from/to memory and has not completed yet. In an embodiment, a rank is selected if the predictive memory scheduler 122 has powered up that rank (FIG. 5, step 518). In an embodiment, a requested rank is powered up and activated for a requested operation to that rank (FIG. 5, step 518). A rank may also be powered up via a predictive power up operation (FIG. 5, step 522). If rank i was requested, but not selected, (decision step 614, 'Yes' branch), ACi is set to a predefined active window size, Xi cycles (step 616). Rank i is now queued to be considered for selection by predictive memory scheduler 122. Steps 614 and 616 are repeated as long as rank i is not selected for scheduling during successive cycles. Rank i thus remains 'requested but not selected' as long as it is not selected for operation.

If rank i is selected during the latest cycle, for example due to powering up of the rank for queued memory requests (FIG. 5, step 518) or due to predictive powering up of the rank (FIG. 5, step 522), predictive memory scheduler 122 checks whether ACi is positive (decision step 618). If ACi is positive (decision step 618, 'Yes' branch), ACi is decremented, for example, by 1 (step 620), and processing continues with step 614. Rank i is now considered selected for operation and continues to be 'active' despite the absence of future memory requests, as long as ACi is positive.

If ACi is not positive (decision step 618, 'No' branch), ICi is set to 0 (step 622) and rank i is now considered 'inactive'. Rank i may be powered down by the DRAM controller, as described with reference to FIG. 5 (step 514), or it may remain powered up by a predictive power up (FIG. 5, step 522). Predictive memory scheduler 122 then checks if rank i has had a memory request during the latest cycle (decision step 624). If not (decision step 624, 'No' branch), ICi is incremented, for example by 1 (step 626). Steps 624 and 626 are repeated as long as rank i is not requested for a memory operation during successive cycles. If rank i has had a memory request during the latest cycle (decision step 624, 'Yes' branch), predictive memory scheduler 122 determines whether the value of ICi is greater than a predefined threshold Y (decision step 628). If so (decision step 628, 'Yes' branch), the value of Xi is reduced by a predetermined amount (step 630). ACi is set to the new value of Xi (step 612). Processing then continues at step 614. If the value of ICi is not greater than Y (decision step 628, 'No' branch), the value of Xi is increased by a predefined amount (step 632). ACi is set to the new value of Xi (step 612). Processing then continues at step 614.

For each rank i, a value for the threshold Y, the initial active window size Xi, and the amount to increase or decrease the active window size must be available to predictive memory scheduler 122. In various embodiments of the invention, these values may be the same for all ranks, or may vary from rank to rank. For example, the values may be selected heuristically, based on timing properties of the DRAM, or may be chosen based on an optimization procedure. In an embodiment of the invention, the amount that Xi is decreased may differ from the amount that Xi is increased. This may provide extra flexibility in reacting to rapidly changing conditions. In various embodiments, upper and lower bounds for Xi, ACi, and ICi may be maintained in order to prevent any of the values from becoming negative and, for example, to prevent overflow or underflow.

In an embodiment of the invention, the value of Xi is not allowed to go below a value corresponding to an amount of time representative of the time required to complete a memory fetch or store operation.

In an embodiment of the invention, predictive memory scheduler 122 prioritizes ranks for powering up in order of their corresponding active count value ACi. In an embodiment of the invention, predictive memory scheduler 122 prioritizes ranks for predictively powering up in order of their corresponding active window size Xi.

In an embodiment of the invention, predictive memory scheduler 122 may treat a predefined group of two or more ranks as if they were a single rank in performing predictive memory scheduling.

Figure 7:
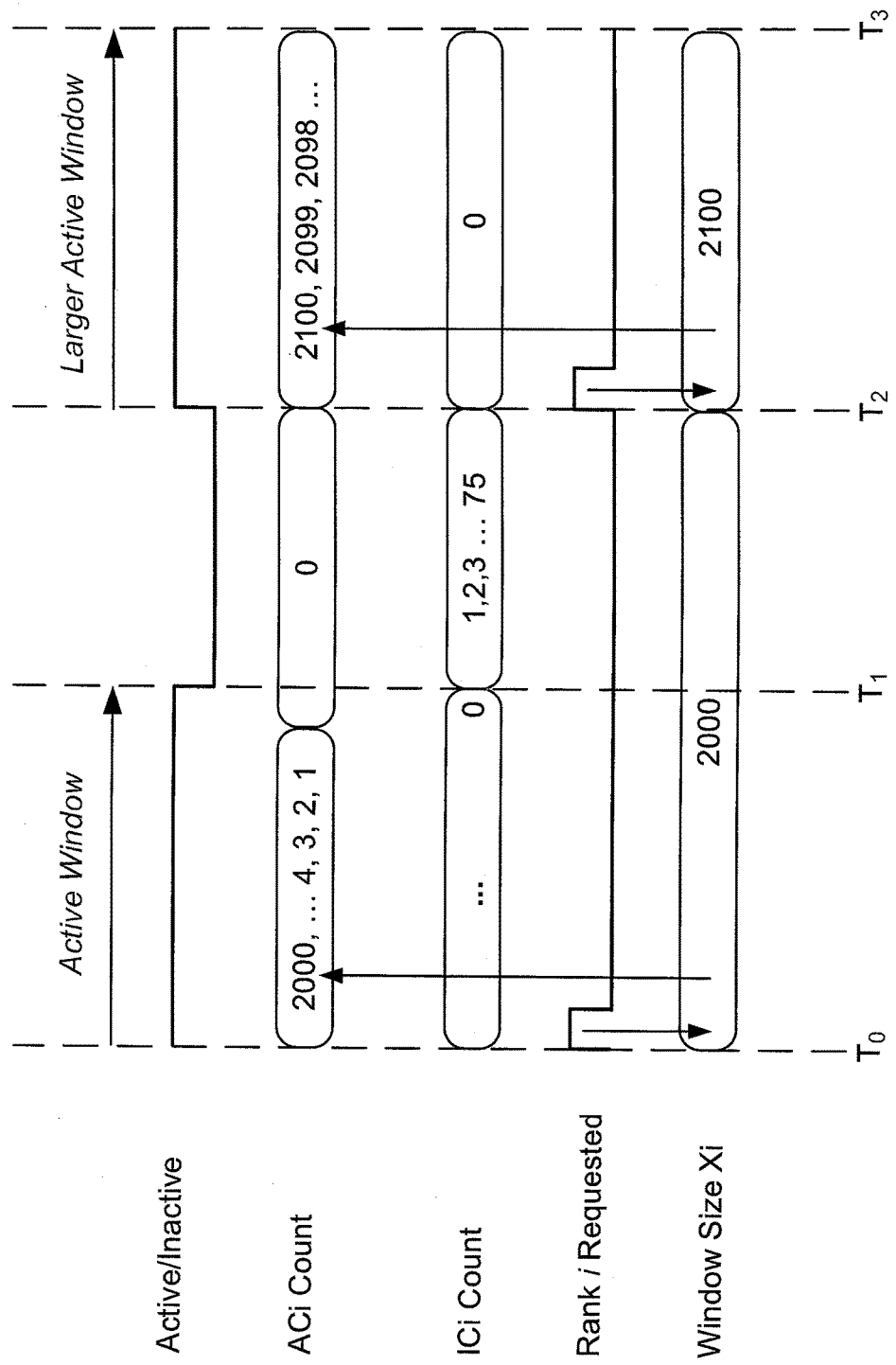
FIG. 7 is a workflow diagram in an example of memory access scheduling, in accordance with an embodiment of the present invention.

FIG. 7 illustrates an example of predictive memory scheduling for a rank i during a given time interval $T_0$-$T_3$, in accordance with an embodiment of the present invention. In this example, the starting active window size Xi is 2000 clock cycles and the threshold Y is 100 clock cycles. At time $T_0$, ACi contains Xi, indicating that predictive memory scheduler 122 received a memory request and accessed rank i during the latest cycle, so rank i is active. However, rank i will not be accessed again until time $T_2$. After each cycle starting with time $T_0$ during which rank i was not accessed, ACi is decremented by 1, until ACi contains 0. At this point ICi is set to 0 and rank i is considered inactive. At the next cycle, starting at time $T_1$, after each additional cycle during which rank i is not accessed, ICi is incremented, for example by 1. At the cycle that ends at time $T_2$, predictive memory scheduler receives a next memory request and accesses rank i when the value of ICi is 75, which is less than the threshold Y. The active window size is therefore increased by a predefined amount, in this case by 100 cycles.

In the example of FIG. 7, predictive memory scheduler 122 may decide to increase the active window size, since the next memory access request after leaving the active state came earlier than expected (as measured by threshold Y) and, therefore, keeping the rank active longer rather than making it inactive might be advantageous.

Figure 8:
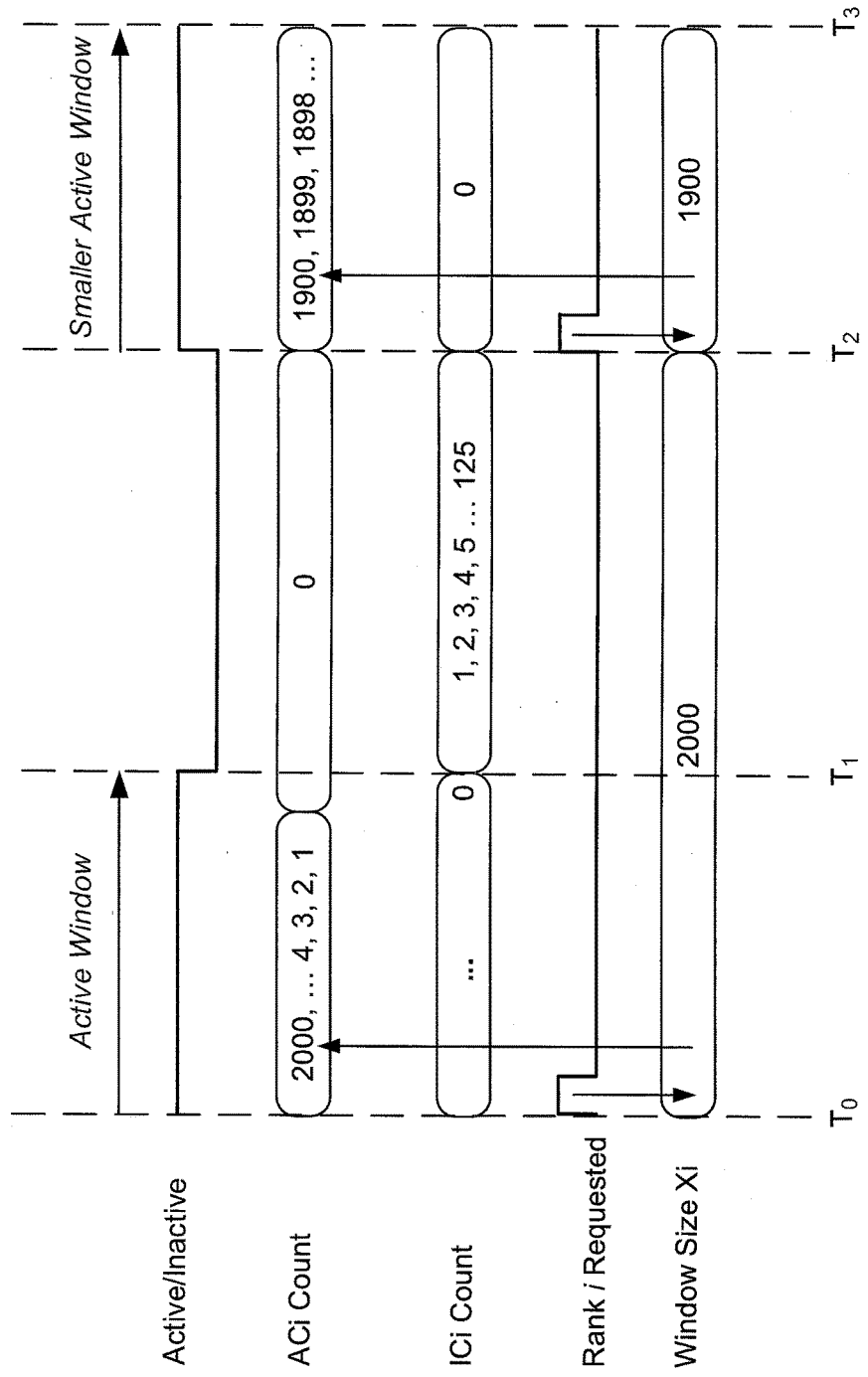
FIG. 8 is a workflow diagram in another example of memory access scheduling, in accordance with an embodiment of the present invention.

FIG. 8 illustrates another example of predictive memory scheduling for a rank i during a given time interval $T_0$-$T_3$, in accordance with an embodiment of the present invention. In this example, again, the starting active window value Xi is 2000 clock cycles and the threshold Y is 100 clock cycles. At time $T_0$, ACi equals Xi, indicating that predictive memory scheduler 122 receives a memory request and accesses rank i during the latest cycle, so rank i is active. However, rank i will not be accessed again until time $T_2$. After each cycle starting with time $T_0$ during which rank i was not accessed, ACi is decremented by 1, until ACi is 0. At this point ICi is set to 0 and rank i is considered inactive. At the next cycle, starting at time $T_1$, after each additional cycle during which rank i is not accessed, ICi is incremented, for example by 1. At the cycle that ends at time $T_2$, predictive memory scheduler 122 receives a memory request and accesses rank i when the value of ICi is 125, which is greater than the threshold Y. The active window size is therefore reduced by a predefined amount, in this case by 100 cycles.

In this example, predictive memory scheduler 122 may decide to decrease the active window size, since the next memory access request came later than expected (as measured by threshold Y) after entering the inactive state, and, therefore, making the rank inactive sooner might be advantageous.

Figure 9:
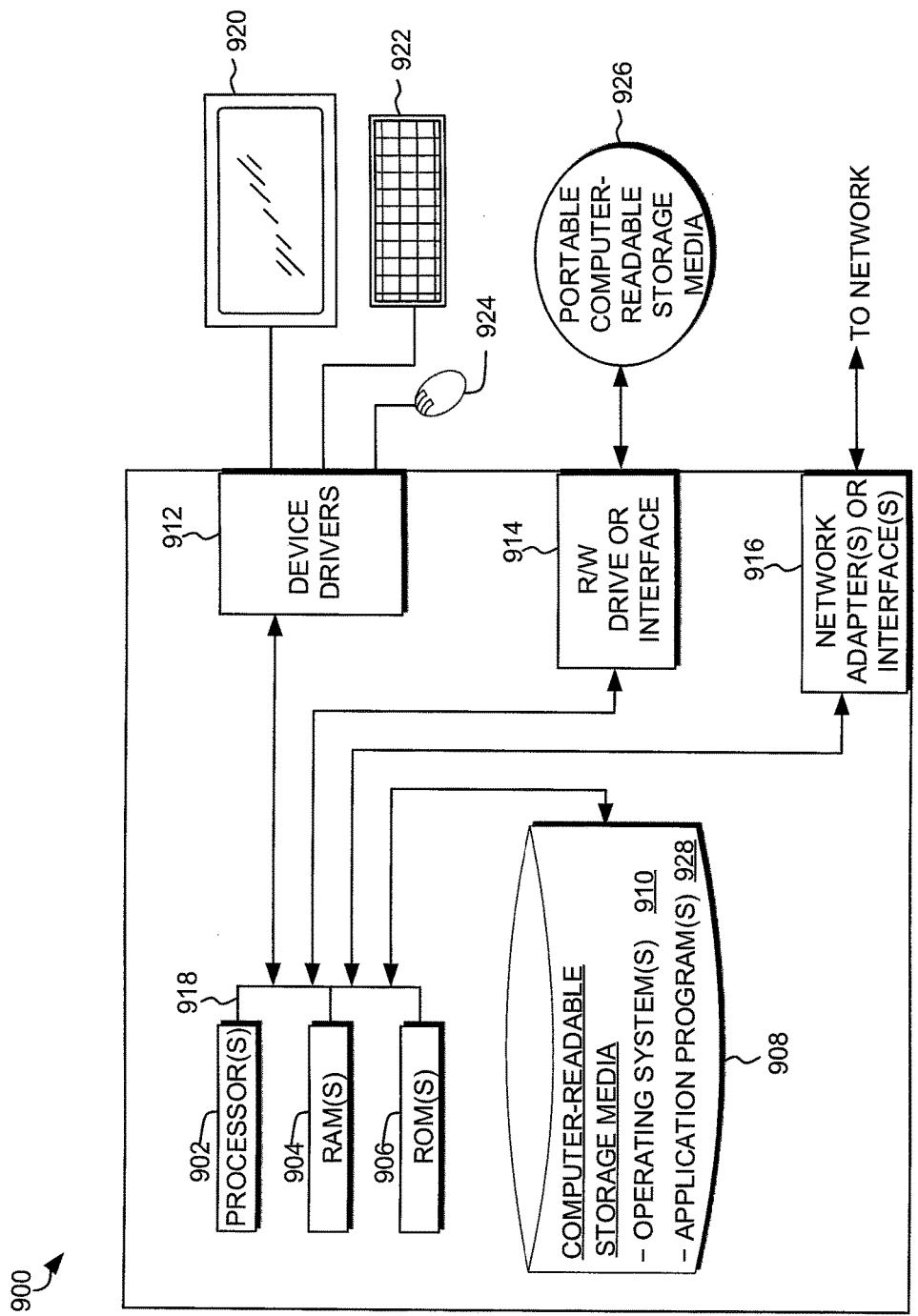
FIG. 9 is a block diagram of components of a computing device, in accordance with an embodiment of the present invention.

FIG. 9 depicts a block diagram of components of a computing device 110, in accordance with an embodiment of the present invention. It should be appreciated that FIG. 9 provides only an illustration of one implementation and does not imply any limitations with regard to the environments in which different embodiments may be implemented. Many modifications to the depicted environment may be made.

Computing device 900 may include one or more processors 902, which may include DRAM controller 120 (FIG. 1), one or more computer-readable RAMs 904, such as DIMMs 110, one or more computer-readable ROMs 906, one or more computer readable storage media 908, device drivers 912, read/write drive or interface 914, network adapter or interface 916, all interconnected over a communications fabric 918. Communications fabric 918 may be implemented with any architecture designed for passing data and/or control information between processors (such as microprocessors, communications and network processors, etc.), system memory, peripheral devices, and any other hardware components within a system.

One or more operating systems 910, and one or more application programs 928, are stored on one or more of the computer readable storage media 908 for execution by one or more of the processors 902 via one or more of the respective RAMs 904 (which typically include cache memory). In the illustrated embodiment, each of the computer readable storage media 908 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

Computing device 900 may also include a R/W drive or interface 914 to read from and write to one or more portable computer readable storage media 926. Application programs 928 on computing device 900 may be stored on one or more of the portable computer readable storage media 926, read via the respective R/W drive or interface 914 and loaded into the respective computer readable storage media 908.

Computing device 900 may also include a network adapter or interface 916, such as a TCP/IP adapter card or wireless communication adapter (such as a 4G wireless communication adapter using OFDMA technology). Application programs 928 on computing device 900 may be downloaded to the computing device from an external computer or external storage device via a network (for example, the Internet, a local area network or other wide area network or wireless network) and network adapter or interface 916. From the network adapter or interface 916, the programs may be loaded onto computer readable storage media 908. The network may comprise copper wires, optical fibers, wireless transmission, routers, firewalls, switches, gateway computers and/or edge servers.

Computing device 900 may also include a display screen 920, a keyboard or keypad 922, and a computer mouse or touchpad 924. Device drivers 912 interface to display screen 920 for imaging, to keyboard or keypad 922, to computer mouse or touchpad 924, and/or to display screen 920 for pressure sensing of alphanumeric character entry and user s. The device drivers 912, R/W drive or interface 914 and network adapter or interface 916 may comprise hardware and software (stored on computer readable storage media 908 and/or ROM 906).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for scheduling memory accesses in a memory system, wherein the memory system is a multi-rank dynamic random access memory (DRAM) system having a plurality of ranks of memory, at most a total of r ranks is powered up concurrently, wherein r is less than the plurality of ranks, the method comprising:

in response to determining that fewer than r ranks are powered up, wherein the determining that fewer than r ranks are powered up is performed in response to a clock period, wherein the clock period is one of: a clock cycle or a memory cycle, and wherein determining that fewer than r ranks are powered up comprises powering up a subset of requested powered down ranks of the plurality of ranks, such that the at most a total of r ranks is powered up concurrently, wherein the subset of requested powered down ranks of the plurality of ranks to be powered up comprises a most frequently accessed requested powered down ranks of the plurality of ranks, wherein each of the most frequently accessed requested powered down ranks of the plurality of ranks is based on a number of memory requests received within a defined time window for that rank, respectively, wherein for each rank of the plurality of ranks the defined time window corresponds to an interval of time during which the rank has received a sequence of memory requests based on a respective AC value and wherein the respective AC value is an active count number, determined based on a number of memory requests received by the requested powered down ranks of the plurality of ranks; and then in response to determining that fewer than the r ranks are powered up, powering up a subset of unrequested powered down ranks of the plurality of ranks, such that the at most a total of r ranks is powered up concurrently, wherein the subset of unrequested powered down ranks of the plurality of ranks to be powered up comprises a most frequently accessed unrequested powered down ranks of the plurality of ranks, wherein each of the most frequently accessed unrequested powered down ranks of the plurality of ranks is based on the number of memory requests received within the defined time window for that rank, respectively, wherein for each rank of the plurality of ranks the defined time window corresponds to the interval of time during which the rank has received a sequence of memory requests based on a respective X value, and wherein the respective X value is a positive integer determined based on the respective AC value.

* * * * *